United States Patent
Tsai et al.

(10) Patent No.: US 6,737,307 B2
(45) Date of Patent: May 18, 2004

(54) METHOD FOR FORMING AMORPHOUS SILICON FILM ON SINGLE CRYSTAL SILICON AND STRUCTURE FORMED

(75) Inventors: Po-Hao Tsai, Banchinu (TW); Nai-Hao Kuo, Kaonsiung (TW); Wen-Jiun Liu, Miaoli (TW); Yuh-Wen Lee, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 10/185,034

(22) Filed: Jun. 28, 2002

(65) Prior Publication Data

US 2004/0002204 A1 Jan. 1, 2004

(51) Int. Cl.$^7$ .......................... H01L 21/00; H01L 21/84
(52) U.S. Cl. ....................................... 438/166; 438/149
(58) Field of Search .................................. 438/149, 166

(56) References Cited

U.S. PATENT DOCUMENTS

| | | | |
|---|---|---|---|
| 6,084,648 A | * 7/2000 | Yeo | 349/40 |
| 6,255,148 B1 | * 7/2001 | Hara et al. | 438/166 |
| 6,291,329 B1 | * 9/2001 | Huang et al. | 438/585 |
| 6,306,692 B1 | * 10/2001 | Seo et al. | 438/149 |
| 6,355,546 B1 | * 3/2002 | Huang et al. | 438/585 |
| 6,531,348 B2 | * 3/2003 | Kim et al. | 438/166 |
| 6,541,323 B2 | * 4/2003 | Yang et al. | |
| 2002/0177283 A1 | * 11/2002 | Hwang et al. | 438/300 |
| 2003/0042486 A1 | * 3/2003 | Sano et al. | |

* cited by examiner

Primary Examiner—Long Pham
(74) Attorney, Agent, or Firm—Tung & Associates

(57) ABSTRACT

A method for forming amorphous silicon films with low defect density on single crystal silicon substrates and structures formed. The method is carried out by first providing a single crystal silicon substrate, then depositing a buffer layer by a material such as silicon oxide, silicon nitride, silicon carbide or a metal on top of the single crystal silicon substrate. An amorphous silicon film of substantial thickness, i.e. of thicker than 1 $\mu$m, is then deposited on top of the buffer layer achieving a smooth top surface.

12 Claims, 1 Drawing Sheet

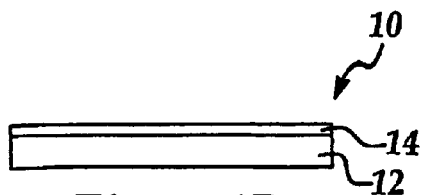
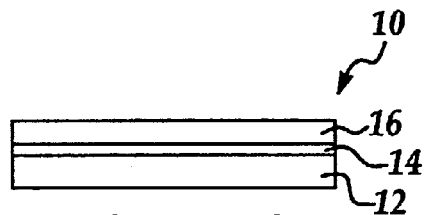
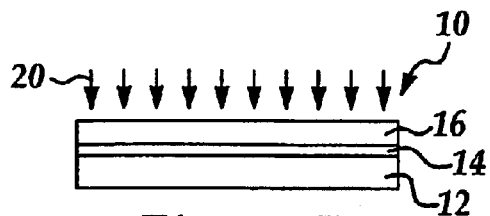
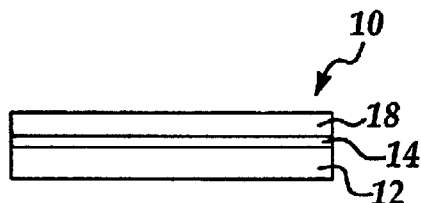
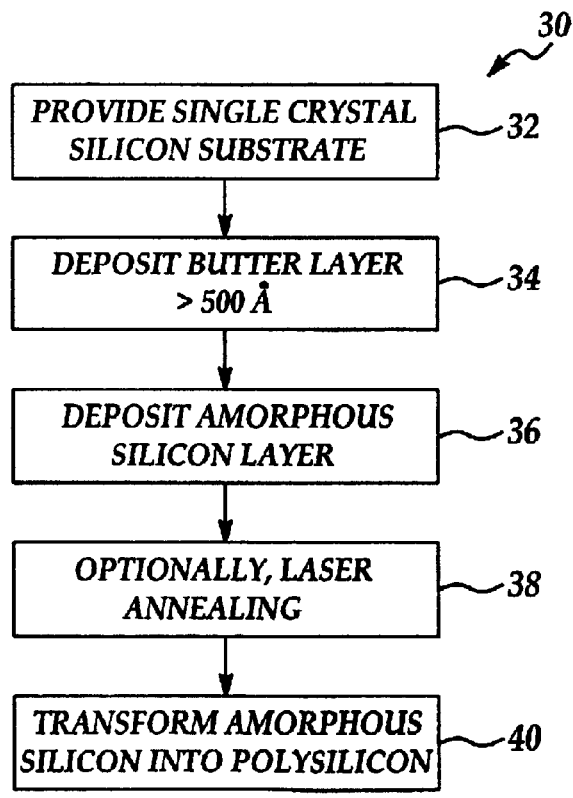

METHOD FOR FORMING AMORPHOUS SILICON FILM ON SINGLE CRYSTAL SILICON AND STRUCTURE FORMED

FIELD OF THE INVENTION

The present invention generally relates to a method for microelectronics fabrication and the microelectronic structure formed and more particularly, relates to a method for forming amorphous silicon films on a single crystal silicon substrate and the semiconductor structure formed.

BACKGROUND OF THE INVENTION

In semiconductor fabrication technology, thin films of silicon that does not have a single crystal structure are frequently used in forming microelectronic devices. These non-single crystal silicon includes amorphous silicon and polycrystalline silicon. For instance, amorphous silicon is widely used in the formation of TFT (thin film transistor) devices and for CMOS gates when a dual gate process is used. Polysilicon films have numerous applications in forming microelectronic devices including gate conductors in MOSFETs when the films are heavily doped, as a dopant source for contacts of shallow junctions in bipolar transistors, and as a conducting layer for interconnections. The amorphous and polysilicon thin films can be formed by a variety of chemical vapor deposition techniques, i.e. LPCVD (low pressure chemical vapor deposition), PECVD (plasma enhanced chemical vapor deposition) and RTCVD (room temperature chemical vapor deposition). The amorphous silicon films can also be formed by a physical vapor deposition technique. The chemical vapor deposition technique is carried out typically by the decomposition process of a silicon-containing gas, such as silane ($SiH_4$) or disilane ($Si_2H_6$) with or without a diluting gas of argon. For a LPCVD process, the typical deposition temperature runs between 500° C. and 700° C. at a typical chamber pressure from 100 mTorr and 500 Torr. The structure of the silicon film deposited, i.e. of either amorphous or polycrystalline, depends mainly on the deposition temperature. For instance, amorphous silicon films are normally deposited at a deposition temperature below 575° C. A transition between the amorphous structure and the polycrystalline structure occurs between the temperature of 575° C. and 600° C. such that polycrystalline silicon is normally deposited at a temperature higher than 580° C. The amorphous silicon structure which has no detectable crystallinity can be converted to polycrystalline structures upon further heat treatment above 600° C. The grain size increases upon heat treatment at even higher temperatures.

When an amorphous silicon film is directly deposited on top of a single crystal silicon substrate, problems of surface imperfection is frequently observed. The surface imperfection appears in the form of unevenness due to irregularly formed protrusions, or islands on the top surface of the amorphous silicon film layer. The obtaining of a smoothly deposited surface of the amorphous silicon film on top of a single crystal silicon substrate is therefore impossible. This leads to difficulties in using amorphous silicon films in various microelectronic applications incorporating the MEMS (micro-electro-mechanical-system) technique such as the fabrication of a cantilever beam for a micro-relay, or in the fabrication of a suspended mirror in a digital mirror display, or in a glass-to-glass bonding application, or in the solar cell application. In the above discussed microelectronic applications that incorporate the MEMS technique, an amorphous silicon film that has a smooth top surface and a minimum defect density on the top surface must be obtained.

For instance, in the application of the cantilever beam for the micro-relay and the suspended mirror in the digital mirror display, a key element for the MEMS process is the capability of growing a relatively thick amorphous silicon film that has a smooth top surface. The amorphous silicon film is frequently used as a sacrificial layer, i.e. to be later removed, in these applications. While currently the amorphous silicon film may be grown by LPCVD, PECVD or PVD, various processing difficulties exist that prevent the successful implementation of these deposition techniques. For instance, in order to form an amorphous silicon film that has low surface defect density by the LPCVD method, the deposition temperature must be around 550° C. which is not compatible with the CMOS process. On the other hand, when the amorphous silicon film is deposited by the PVD technique, the film produced has poor adhesion and thus greatly limits its deposition thickness.

It is therefore an object of the present invention to provide a method for forming amorphous silicon films on single crystal silicon substrates that does not have the drawbacks or shortcomings of the conventional methods.

It is another object of the present invention to provide a method for forming amorphous silicon films that have low defect density and a smooth top surface on a single crystal silicon substrate.

It is a further object of the present invention to provide a method for forming amorphous silicon films-on single crystal silicon substrates that are compatible with a front-end CMOS process.

It is another further object of the present invention to provide a method for forming amorphous silicon films on single crystal silicon substrates that does not require an annealing process after the deposition.

It is still another object of the present invention to provide a method for forming amorphous silicon films on single crystal silicon substrates that can be integrated with a MEMS process.

It is yet another object of the present invention to provide a semiconductor structure of an amorphous silicon film deposited on a single crystal silicon substrate with a smooth top surface on the amorphous silicon film.

It is still another further object of the present invention to provide a semiconductor structure on a single crystal silicon substrate that includes a single crystal silicon substrate, a buffer layer on top of the substrate, and an amorphous silicon film deposited on top of the buffer layer.

It is yet another further object of the present invention to provide a semiconductor structure that is built on a single crystal silicon substrate including a buffer layer of silicon oxide, silicon nitride, silicon carbide or metal in-between an amorphous silicon film and a single crystal silicon substrate.

SUMMARY OF THE INVENTION

In accordance with the present invention, a method for forming amorphous silicon films that have low defect density on a single crystal silicon substrate and structures formed are provided.

In a preferred embodiment, a method for forming amorphous silicon films with low defect density on single crystal silicon can be carried out by the operating steps of providing a single crystal silicon substrate; depositing a buffer layer in a material capable of surviving a process temperature of 500° C. on top of the single crystal silicon substrate, the buffer layer has a thickness of at least 500 Å; and depositing an amorphous silicon film on a top surface of the buffer layer.

The method for forming amorphous silicon films with low defect density on single crystal silicon may further include the step of selecting the material for the buffer layer from the group consisting of silicon oxide, silicon nitride, silicon carbide and metals, or the step of depositing the buffer layer to a thickness between about 500 Å and about 1500 Å, or the step of depositing the buffer layer by a technique selected from the group consisting of chemical vapor deposition, plasma enhanced chemical vapor deposition and physical vapor deposition. The method may further include the step of depositing the amorphous silicon film by a technique selected from the group consisting of plasma enhanced chemical vapor deposition, low pressure chemical vapor deposition, room temperature chemical vapor deposition and physical vapor deposition, or the step of depositing the amorphous silicon film to a thickness between about 1 $\mu$m and about 10 $\mu$m, or the step of depositing the amorphous silicon film in a deposition chamber fabricated of stainless steel.

The method for forming amorphous silicon films with low defect density on single crystal silicon may further include the step of depositing the amorphous silicon film in a plasma enhanced chemical vapor deposition chamber at a deposition temperature between about 275° C. and about 375° C., or the step of depositing the amorphous silicon film in a plasma enhanced chemical vapor deposition chamber at a deposition power between about 50W and about 400W, or the step of depositing the amorphous silicon film at a chamber pressure between about 400 mTorr and about 900 mTorr, or the step of depositing the amorphous silicon film in a chemical vapor deposition chamber by flowing in a precursor selected from the group consisting of $SiH_4$ and $SiH_4$/argon mixture. The method may further include the step of annealing by laser energy the amorphous silicon film into a polysilicon film.

The invention is further directed to a semiconductor structure that is built on a single crystal silicon substrate which includes a single crystal silicon substrate; a buffer layer on top of the single crystal silicon substrate formed of a material capable of surviving a process temperature of 500° C., the buffer layer has a thickness of at least 500 Å; and an amorphous silicon film that has substantially no-surface defect on top of the buffer layer.

The semiconductor structure that is built on a single crystal silicon substrate may further include a polysilicon film on top of the buffer layer in place of the amorphous silicon film. The buffer layer may be formed of a material selected from the group consisting of silicon oxide, silicon nitride, silicon carbide and metals. The buffer layer may have a thickness between about 500 Å and about 1500 Å. The amorphous silicon film may have a thickness between about 1 $\mu$m and about 10 $\mu$m. The amorphous silicon film may be formed in a cantilever beam for a micro-relay device, or may be formed on a suspended mirror for a digital mirror display device, or may be formed and converted to polysilicon as an electrode in a solar cell.

BRIEF DESCRIPTION OF THE DRAWINGS

These and other objects, features and advantages of the present invention will become apparent from the following detailed description and the appended drawings in which:

FIG. 1A is an enlarged, cross-sectional view of a single crystal silicon substrate used in the present invention.

FIG. 1B is an enlarged, cross-sectional view of the present invention single crystal silicon substrate with a buffer layer deposited on top.

FIG. 1C is an enlarged, cross-sectional view of the present invention single crystal silicon substrate/buffer layer with an amorphous silicon layer deposited on top.

FIG. 1D is an enlarged, cross-sectional view of an optional step wherein the amorphous layer is annealed by laser energy.

FIG. 1E is an enlarged, cross-sectional view of the present invention single crystal silicon substrate/buffer layer structure with the top amorphous silicon layer converted to polysilicon.

FIG. 2 is a process flow chart of the present invention method.

DETAILED DESCRIPTION OF THE PREFERRED EMBODIMENT

The present invention discloses a method for forming amorphous silicon films on single crystal silicon substrates and structures formed.

The method for forming amorphous silicon films that have low defect density on single crystal silicon substrates can be carried out by first providing a single crystal silicon substrate, then depositing a buffer layer on top of the single crystal silicon substrate, and then depositing an amorphous silicon layer on top of the buffer layer. The buffer layer deposited is formed in a material that is capable of surviving a process temperature of up to 500° C. The buffer layer deposited has a thickness of at least 500 Å, and preferably a thickness between about 500 Å and about 1500 Å. The material used in forming the buffer layer may be silicon oxide, silicon nitride, silicon carbide or any one of suitable metals.

The invention further discloses the techniques for depositing the buffer layer by chemical vapor deposition, by plasma enhanced chemical vapor deposition or by physical vapor deposition. The invention further discloses that the amorphous silicon film can be deposited by a technique of plasma enhanced chemical vapor deposition, or low pressure chemical vapor deposition, or room temperature chemical vapor deposition, or physical vapor deposition. A suitable thickness of the amorphous silicon film deposited is between about 1 $\mu$m and about 10 $\mu$m. The present invention therefore allows the formation of a relatively thick amorphous silicon layer that has very low defect density, i.e. one that has a smooth top surface.

The amorphous silicon film of the present invention can be deposited in a plasma enhanced chemical vapor deposition chamber fabricated of stainless steel at a deposition temperature between about 275° C. and about 375° C., at a deposition power between about 50W and about 400W, and at a chamber pressure between about 400 mTorr and about 900 mTorr. The precursor utilized in the chemical vapor deposition may be silane or silane/argon mixture.

The present invention forms a relatively thick, i.e. between about 1 $\mu$m and about 10 $\mu$m, film of amorphous silicon on top of a single crystal silicon substrate wherein the amorphous silicon film formed has a smooth top surface with minimum defect density by adding a buffer layer in-between the amorphous silicon layer and the single crystal silicon substrate. The buffer layer may be formed of an insulating material such as silicon oxide, silicon nitride or silicon carbide, or by a conductive material such as metal. The present invention method produces an amorphous silicon layer that has minimum defect density and a large thickness. The amorphous silicon layer produced by the present invention method does not require a thermal annealing process, and does not require a deposition process at higher than 350° C. such that the present invention deposition method can be advantageously integrated with a MEMS technique necessary for protecting the front-end CMOS devices. The simplicity in the deposition process and the easy integration with the CMOS process are other benefits achieved by the present invention method. The present invention method further reduces the irregularities or pitting in the surface layer of the amorphous silicon film deposited. The amorphous silicon film deposited therefore is not affected by the single crystal silicon substrate. The quality improvement made possible by the present invention method can be easily observed under optical microscope or under scanning electron microscope.

The present invention method for forming amorphous silicon films with low defect density on single crystal silicon substrates is shown in FIGS. 1A–1E in enlarged, cross-sectional views, and in FIG. 2 in a process flow chart.

The present invention method for forming amorphous silicon film on single crystal silicon substrate to produce a structure 10 can be started by first providing a single crystal silicon substrate 12, as shown in FIG. 1A. The single crystal silicon substrate 12 is formed of single crystals of silicon in the crystal orientation of (100) or (111).

On top of the single crystal silicon substrate 12, is then deposited a buffer layer 14 formed of a material selected from silicon oxide, silicon nitride, silicon carbide or a suitable metal. The thickness of the buffer layer may be suitably between about 500 Å and about 1500 Å. The term "about" used in this writing indicates a range of values that are ±10% of the average value given.

The buffer layer 14 may be deposited by a variety of techniques, i.e. such as chemical vapor deposition, plasm enhanced chemical vapor deposition and physical vapor deposition. This is shown in FIG. 1B.

In the next step of the process, an amorphous silicon layer 16 that has a thickness in the range between about 1 μm and about 10 μm is deposited on top of the buffer layer 14, as shown in FIG. 1C. The amorphous silicon layer 16 can be deposited to a thickness between about 1 μm and about 10 μm, by a technique such as plasma enhanced chemical vapor deposition, low pressure chemical vapor deposition, room temperature chemical vapor deposition or physical vapor deposition. The deposition chamber is preferably fabricated of stainless steel to minimize the potential of any particle contamination.

In a typical plasma enhanced chemical vapor deposition process for depositing the amorphous silicon layer 16, a deposition temperature between about 275° C. and about 375° C., and preferably between about 300° C. and about 350° C. is utilized. A plasma power in the deposition chamber utilized is between about 50W and about 400W, achieving a chamber pressure between about 400 mTorr and about 900 mTorr. A suitable precursor used in the chemical vapor deposition process may be $SiH_4$ or $SiH_4$/argon mixture.

The present invention amorphous silicon layer 16 may, optionally, be thermally annealed by laser energy 20 after the deposition process, as shown in FIG. 1D. The laser energy 20 heats up the amorphous silicon layer 16 and converts the layer to a polysilicon layer 18, as shown in FIG. 1E. This is an optional process step which may be used with the present invention method for converting the amorphous silicon to polysilicon, when desired.

The present invention novel method is further shown in FIG. 2, in a process flow chart 30 illustrated by process flow steps 32–40. For instance, in process step 42, a single crystal silicon substrate 12 is first provided. The next process step 34, then carries out the deposition of a buffer layer larger than 500 Å thickness on top of the single crystal silicon substrate 12. In the next process step 36, the amorphous silicon layer 16 of larger than 1 μm thickness is formed on top of the buffer layer 14. Process steps 38 and 40 illustrates the optional step of laser annealing and the transformation of the amorphous silicon layer into a polysilicon layer.

The present invention novel method for forming amorphous silicon films with low defect density on single crystal silicon substrate and the structures formed have therefore been amply described in the above description and in the appended drawings of FIGS. 1A–1E and 2.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming amorphous silicon films with low defect density on single crystal silicon comprising the steps of:

providing a single crystal silicon substrate;

depositing a buffer layer in a material capable of surviving a process temperature of 500° C. on top of said single crystal silicon substrate, said buffer layer having a thickness of at least 500 Å; and depositing an amorphous silicon film having a smooth top surface on a top surface of said buffer layer.

2. A method for forming amorphous silicon films with tow defect density on single crystal silicon according to claim 1 further comprising the step of selecting said material for said buffer layer from the group consisting of silicon oxide, silicon nitride, silicon carbide and metals.

3. A method for forming amorphous silicon films with low defect density on single crystal silicon according to claim 1 further comprising the step of depositing said buffer layer to a thickness between about 500 Å and about 1500 Å.

4. A method for forming amorphous silicon films with low defect density on single crystal silicon according to claim 1 further comprising the step of depositing said buffer layer by a technique selected from the group consisting of chemical vapor deposition, plasma enhanced chemical vapor deposition and physical vapor deposition.

5. A method for forming amorphous silicon films with low defect density on single crystal silicon according to claim 1 further comprising the step of depositing said amorphous silicon film by a technique selected from the group consisting of plasma enhanced chemical vapor deposition, low pressure chemical vapor deposition, room temperature chemical vapor deposition and physical vapor deposition.

6. A method for forming amorphous silicon films with low defect density on single crystal silicon according to claim 1 further comprising the step of depositing said amorphous silicon film to a thickness between about 1 μm and about 10 μm.

7. A method for forming amorphous silicon films with low defect density on single crystal silicon according to claim 1 further comprising the step of depositing said amorphous silicon film in a deposition chamber fabricated of stainless steel.

8. A method for forming amorphous silicon films with low defect density on single crystal silicon according to claim 1 further comprising the step of depositing said amorphous silicon film in a plasma enhanced chemical vapor deposition chamber at a deposition temperature between about 275° C. and about 375° C.

9. A method for forming amorphous silicon films with low defect density on single crystal silicon according to claim 1 further comprising the step of depositing said amorphous silicon film in a plasma enhanced chemical vapor deposition chamber at a deposition power between about 50 W and about 400 W.

10. A method for forming amorphous silicon films with low defect density on single crystal silicon according to claim 1 further comprising the step of depositing said amorphous silicon film in a plasma enhanced chemical vapor deposition chamber at a chamber pressure between about 400 mTorr and about 900 mTorr.

11. A method for forming amorphous silicon films with low defect density on single crystal silicon according to claim 1 further comprising the step of depositing said amorphous silicon film in a plasma chemical vapor deposition chamber by flowing in a precursor selected from the group consisting of $SiH_4$ and $SiH_4$/Argon mixture.

12. A method for forming amorphous silicon films with low defect density on single crystal silicon according to claim 1 further comprising the step of annealing by laser energy said amorphous silicon film into a polysilicon film.

* * * * *